(12) United States Patent
Miura (10) Patent No.: US 7,656,503 B2
(45) Date of Patent: Feb. 2, 2010

(54) EXPOSURE APPARATUS AND IMAGE PLANE DETECTING METHOD

(75) Inventor: Seiya Miura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 339 days.

(21) Appl. No.: 11/684,385

(22) Filed: Mar. 9, 2007

(65) Prior Publication Data

US 2007/0296945 A1 Dec. 27, 2007

(30) Foreign Application Priority Data

Mar. 17, 2006 (JP) ............... 2006-074098

(51) Int. Cl.
*G03B 27/54* (2006.01)

(52) U.S. Cl. ............... 355/55; 355/53; 355/77; 356/401; 356/620

(58) Field of Classification Search .......... 355/55, 355/53, 77; 356/399–401, 620
See application file for complete search history.

(56) References Cited

U.S. PATENT DOCUMENTS

| 4,869,999 | A | 9/1989 | Fukuda et al. |
| 4,904,569 | A | 2/1990 | Fukuda et al. |
| 4,937,619 | A | 6/1990 | Fukuda et al. |
| 4,992,825 | A | 2/1991 | Fukuda et al. |
| 5,245,552 | A * | 9/1993 | Andersson et al. .......... 700/280 |
| 5,303,002 | A * | 4/1994 | Yan ............... 355/53 |
| RE36,731 | E | 6/2000 | Fukuda et al. |
| 6,671,294 | B2 | 12/2003 | Kroyan et al. |
| 6,721,340 | B1 | 4/2004 | Fomenkov et al. |
| 6,853,653 | B2 | 2/2005 | Spangler et al. |
| 7,016,025 | B1 * | 3/2006 | Hansen .......... 356/124 |
| 2005/0190801 | A1 | 9/2005 | Sukegawa et al. |
| 2005/0237507 | A1 * | 10/2005 | Koga .......... 355/55 |

FOREIGN PATENT DOCUMENTS

| JP | 2619473 | 3/1997 |
| JP | 2005-191503 | 7/2005 |

* cited by examiner

*Primary Examiner*—Edward J Glick
*Assistant Examiner*—Colin Kreutzer
(74) *Attorney, Agent, or Firm*—Fitzpatrick, Cella, Harper & Scinto (57) ABSTRACT

An exposure apparatus including an illumination optical system to illuminate an original with exposure light of plural wavelengths, a projection optical system to project an image of a pattern of the original onto a substrate, an original-side reference pattern provided at an original side of the projection optical system, a substrate-side reference pattern provided at a substrate side of the projection optical system, and an image plane detecting system configured so that the original-side reference pattern is illuminated with the exposure light or light equivalent to the exposure light with respect to a wavelength component rate.

10 Claims, 11 Drawing Sheets

EXPOSURE APPARATUS AND IMAGE PLANE DETECTING METHOD

FIELD OF THE INVENTION AND RELATED ART

This invention relates to an exposure apparatus for projecting an image of a pattern of an original onto a substrate by use of mixed light having plural wavelengths, and to a method of detecting an image plane position of a projection optical system. The present invention is suitably applicable to a projection exposure apparatus used in a lithographic process for the production of semiconductor devices, liquid crystal display devices or thin-film magnetic heads, for example, for measuring and correcting the image plane position of a projection optical system of the projection exposure apparatus.

Production of microdevices, such as semiconductor devices, uses a simultaneous exposure type exposure apparatus, such as a step-and-repeat exposure apparatus, or a scan type exposure apparatus, such as a step-and-scan exposure apparatus.

Figure 12:
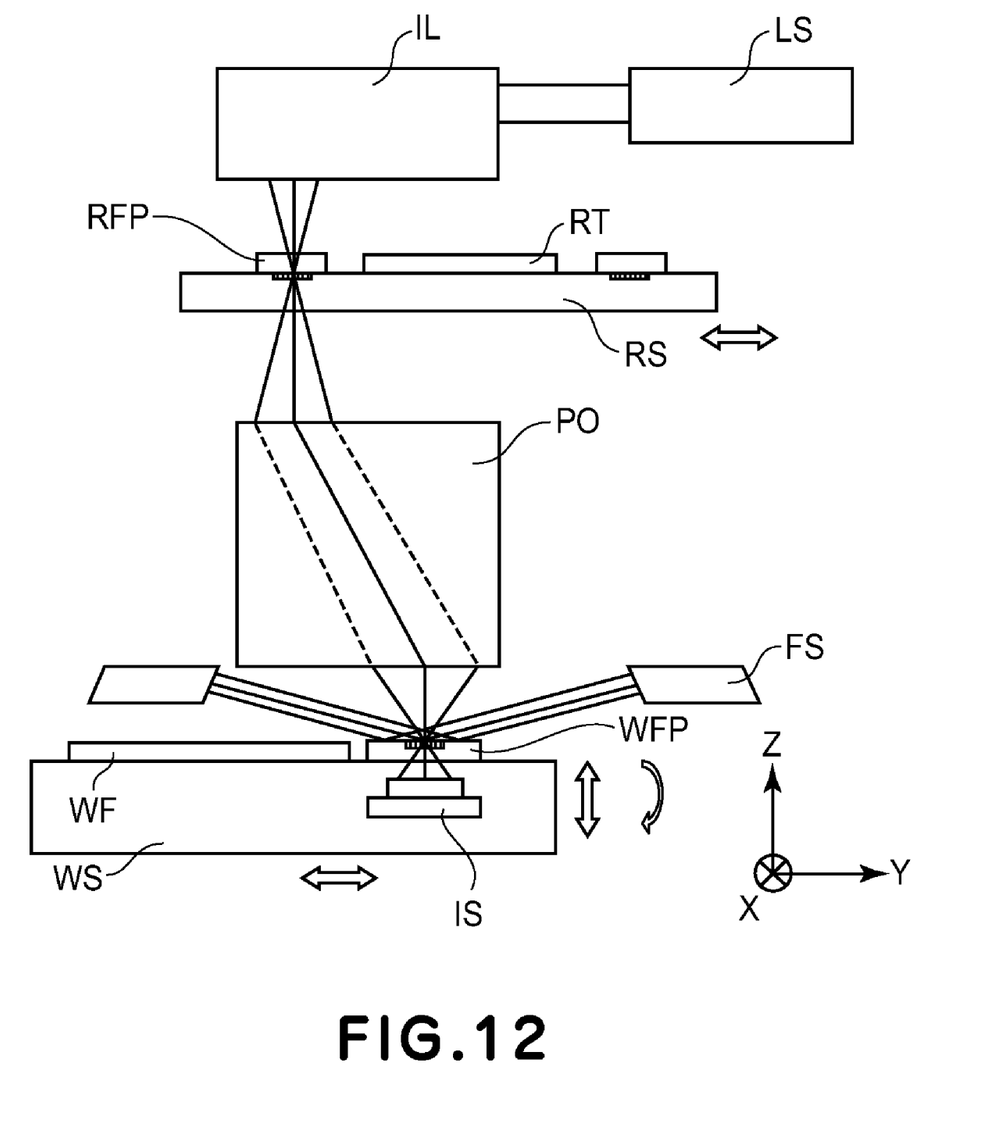
FIG. 12 is a schematic view of a general structure of a conventional scan type exposure apparatus.

FIG. 12 is a schematic view of a general structure of an exposure apparatus.

There is an exposure light source LS, which may comprise a single-wavelength (single-line) laser, such as a KrF laser or an extreme ultraviolet light or an ArF excimer laser having a much narrower wavelength, for example. The light beam emitted from the light source goes through an illumination optical system IL and illuminates a predetermined region on a reticle (mask) RT, which is an original of a pattern. The reticle RT has formed thereon a very fine circuit pattern to be transferred. The image of this pattern is projected by a projection optical system PO onto a wafer WF.

In the projection optical system of these types of projection exposure apparatuses, since a resolving power close to the limit is required there, generally, a mechanism is provided to measure factors such as pressure and temperature, influential to the resolving power, and to correct the imaging characteristic in accordance with the result of the measurement. On the other hand, generally, a large numerical aperture is set for the projection optical system so as to obtain a higher resolving power, and this makes the depth of focus quite shallow.

In order to meet this, the exposure apparatus shown in FIG. 12 is provided with an autofocus mechanism having a focus detecting system FS and a TTL (Through-The-Lens) calibration measuring system IS, for bringing the wafer surface into coincidence with the image plane of the projection optical system PO. Here, the focus detecting system FS comprises an oblique incidence type focus detecting system arranged to detect the position of the wafer WF surface with respect to the optical axis direction of the projection optical system PO. On the other hand, the TTL calibration measuring system IS is arranged to detect the image plane position of the projection exposure optical system PO through the projection optical system PO and to correct the origin for the focus detecting system FS.

As an example of a calibration detecting system, in the case of FIG. 12, a slit-like chart formed on a reticle-side reference plate RFP and comprising a plurality of slit-like patterns being arrayed periodically, is projected on a slit-like chart formed on a wafer-stage-side reference plate WFP, and the quantity of light transmitted therethrough is detected by use of a sensor IS. The reticle-side reference plate RFP is disposed at a height being equivalent to the reticle placed on a reticle stage RS. The wafer-stage-side reference plate WFP is disposed on a wafer-side stage.

Figure 2A:
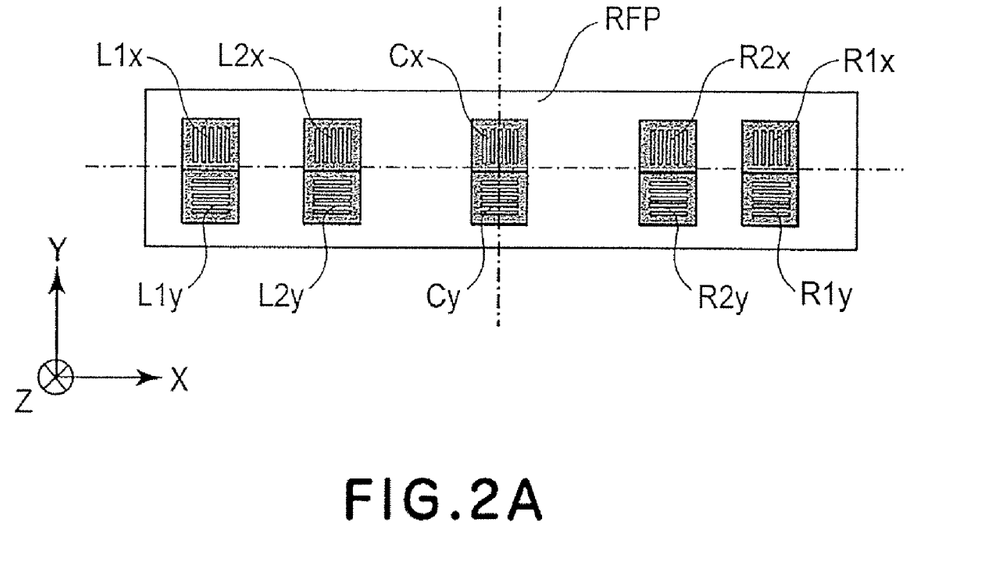
FIG. 2A illustrates a structural example of a reticle-side reference chart.
Figure 2B:
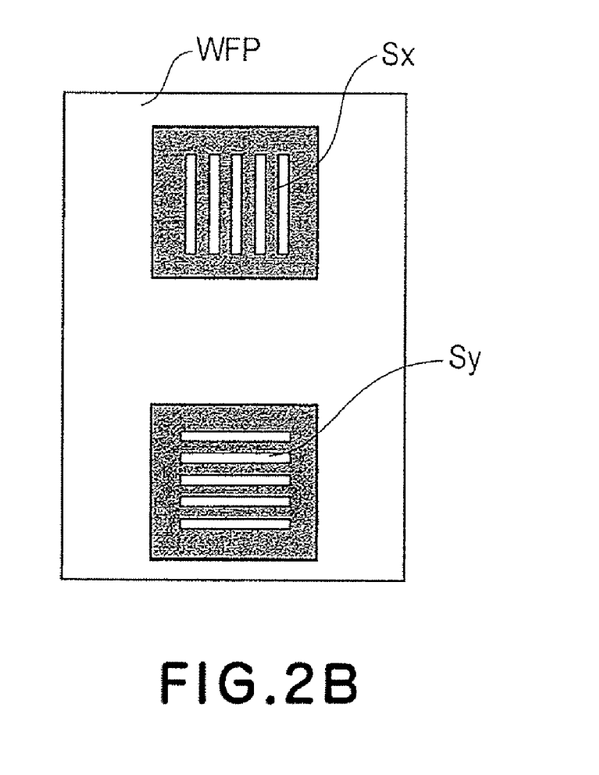
FIG. 2B illustrates a structural example of a wafer-side reference chart.

More specifically, as shown in FIG. 2A, the reticle-side reference plate RFP has formed thereon a plurality of slit-like charts L1x and L1y; L2x and L2y; Cx and Cy; R2x and R2y; and R1x and R1y, which are provided to enable measurement at different image heights inside the exposure region. On the other hand, the wafer-side reference plate has a slit-like chart Sx and Sy formed thereon, as shown in FIG. 2B. The image of the slit-like chart of the reference plate RFP is projected onto the wafer-side reference plate WFP shown in FIG. 2B, and the light transmitted through the slit-like chart of the wafer-side reference plate is detected.

Figure 3:
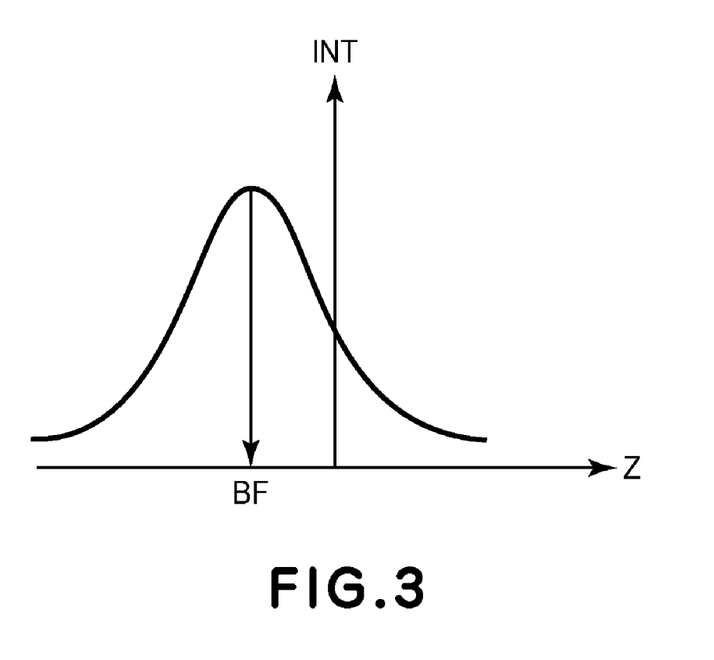
FIG. 3 is a signal waveform view, showing an example of an image-plane-position measurement signal, in the dual-wavelength exposure.

FIG. 3 illustrates an example of an image plane position detection signal. The quantity of transmitted light is detected while changing the relative positional relationship between the reticle-side slit-like chart and the wafer-side slit-like chart with respect to the optical axis direction, and the largest light-quantity point is determined as the image plane position of the projection exposure optical system PO.

Recently, a further decrease of the depth of focus is being considered as a problem from the standpoint of improvement of exposure resolution, and various exposure methods have been proposed to enlarge the depth of focus.

An example is that, in place of using a light source having a single center wavelength, use of a light source having plural center wavelengths (light source of plural wavelengths) has been proposed (see Japanese Patent No. 2619473 and U.S. Pat. No. 6,853,653). In accordance with this method, as a result of using a light source of plural wavelengths as the exposure light source, longitudinal (axial) chromatic aberration is produced in the projection optical system, and this makes the allowable depth of focus larger.

Figure 7A:
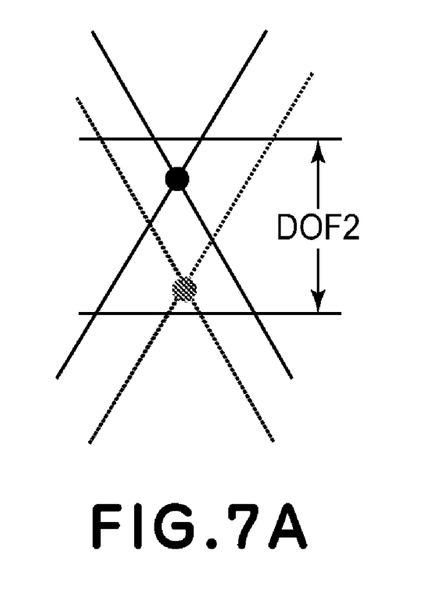
FIG. 7A is a schematic view, showing an example of an image focusing state in the single-wavelength exposure.
Figure 7B:
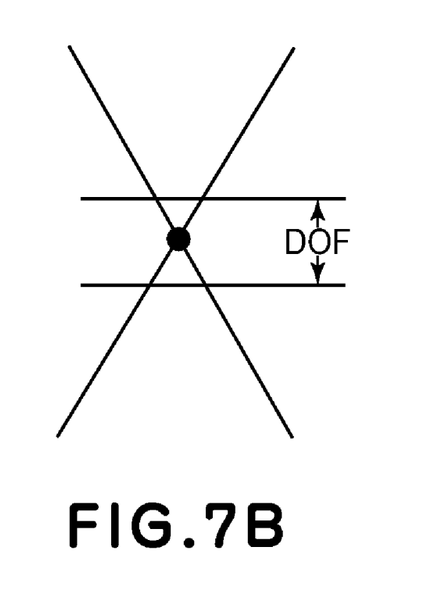
FIG. 7B is a schematic view, showing an example of an image focusing state in the dual-wavelength exposure.
Figure 7C:
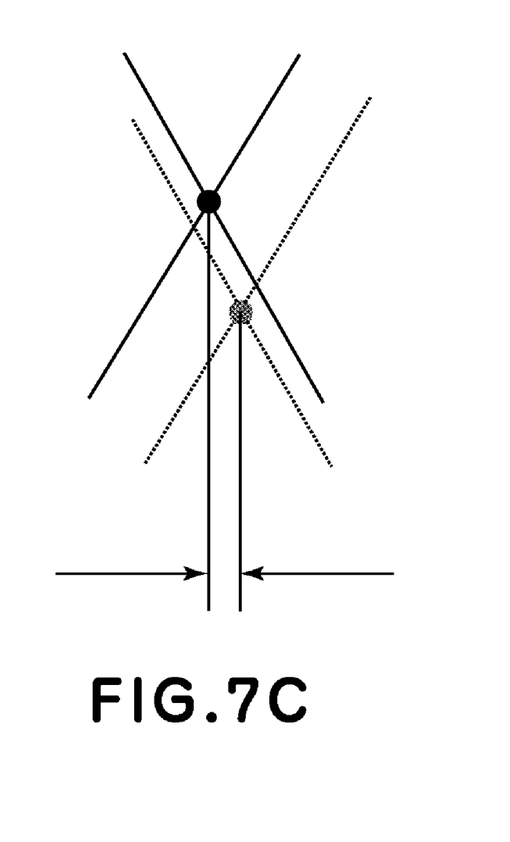
FIG. 7C is a schematic view, showing another example of an image focusing state in the dual-wavelength exposure.

FIGS. 7A-7C are schematic views, illustrating the focusing state of an image.

FIG. 7B shows the focusing state where the exposure is carried out with a single wavelength. The image is focused at a single point. On the other hand, FIG. 7A shows the focusing state where the exposure is carried out with dual wavelengths. Due to longitudinal chromatic aberration resulting from the use of different wavelengths, the image is focused at different points mutually deviated in the optical axis direction (Z direction). Adjacent to the focus, the intensity distribution of the image is averaged with respect to the optical axis direction, and this in effect leads to enlargement of the allowable depth of focus with respect to a desired linewidth.

When a light source of plural wavelengths is used as the exposure light source, in the projection optical system, in addition to the longitudinal chromatic aberration, chromatic aberration of magnification is produced at an abaxial image height and image blur is caused thereby (see FIG. 7C). In an actual exposure process, the influence thereof may be diminished by adjusting the illumination system or exposure condition so as to minimize the image blur adjacent to the image plane position. However, in the TTL calibration measurement, particularly, for the detection of image plane position, measurement-signal detection has to be carried out even to the region outside the allowable depth of focus. Hence, there would be an adverse influence on the signal shape asymmetry, which inconveniently leads to an error factor to the detection of the image plane position of the projection optical system.

More specifically, the calibration measuring system IS is arranged to monitor the change in the signal as the wafer-side reference plate WFP is scanned in the optical axis direction, and it detects the image plane position of the projection optical system by detecting the largest-intensity point or the gravity-center position of the signal. FIG. 3 illustrates such a change in the signal as the wafer-side reference plate WFP is scanned in the optical axis direction.

However, in the image-plane-position detection signal based on the dual-wavelength exposure method, the depth of focus is, in the first place, inherently expanded and, for this reason, there is a difficulty in detecting the signal peak position. From this standpoint, it is desired to discriminate the image plane position on the basis of the gravity-center position of the signal.

Figure 5A:
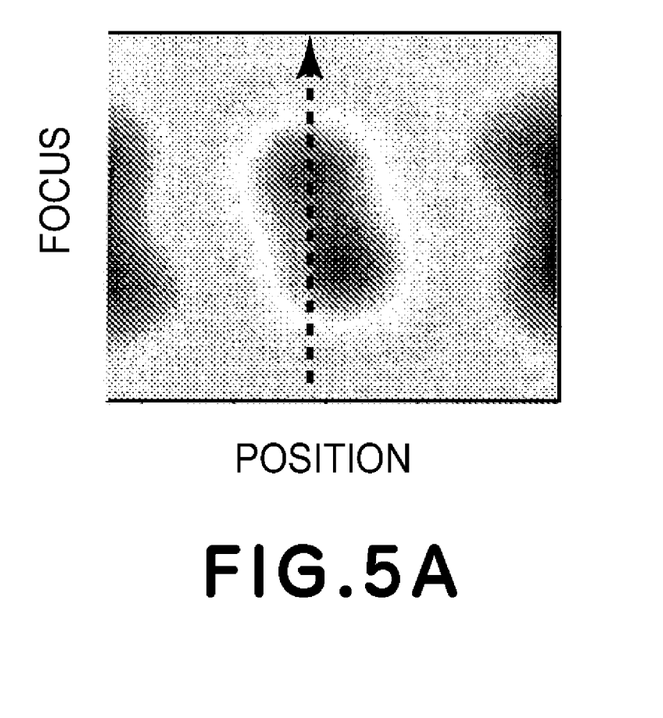
FIG. 5A illustrates an example of an image intensity distribution, in the dual-wavelength exposure.
Figure 6A:
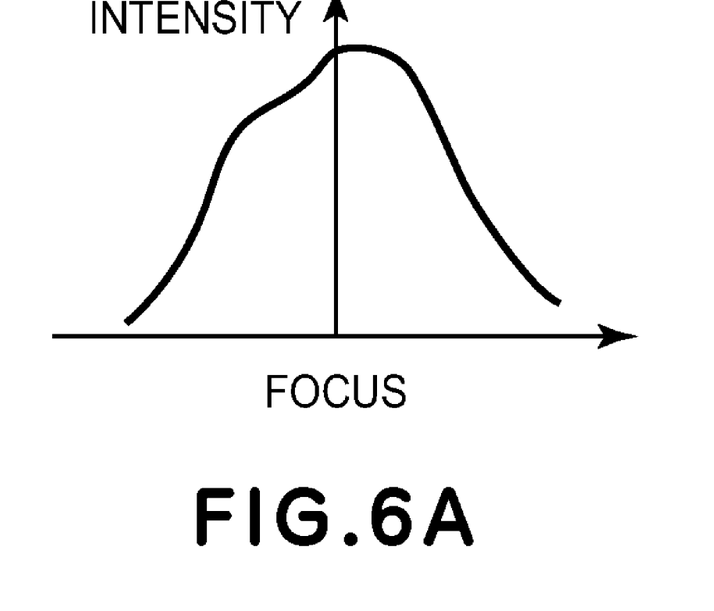
FIG. 6A is a signal waveform view, showing an example of an image-plane-position measurement signal in the dual-wavelength exposure, the example being associated with the example of FIG. 5A.
Figure 6B:
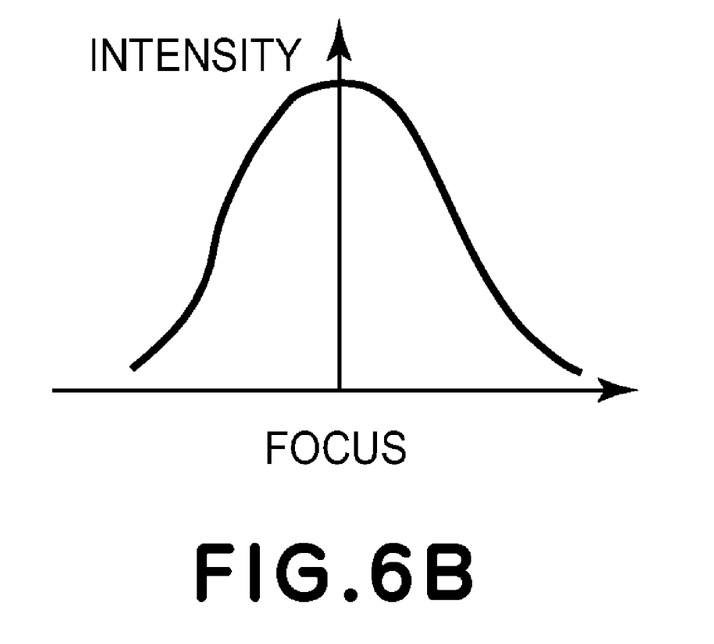
FIG. 6B is a signal waveform view, showing an example of an image-plane-position measurement signal in the dual-wavelength exposure, the example being associated with the example of FIG. 5B.

However, in the measurement at an abaxial image height inside the exposure region, the image of the slit-like chart comprising a plurality of slit-like patterns arrayed periodically in the meridional direction (lens radial direction) of the projection optical system PO, would have an asymmetrical intensity distribution, such as shown in FIG. 5A. This results from chromatic aberration of magnification and longitudinal chromatic aberration. Because of this, the image-plane-position detection signal would have an asymmetrical shape, such as shown in FIG. 6A, with the gravity center position being shifted thereby. This inconveniently causes an error in the measured value of the image plane position. Furthermore, if the scan position with regard to the wafer-side slit-like chart is slightly deviated, the asymmetrical shape of the signal would be changed thereby. This inconveniently causes an error factor for the measured value of the image plane position.

SUMMARY OF THE INVENTION

The present invention in an aspect thereof provides an exposure apparatus having a light source of plural wavelengths, by which the image plane position of a projection optical system can be measured very precisely.

In accordance with an aspect of the present invention, there is provided an exposure apparatus, comprising an illumination optical system configured to illuminate an original with exposure light of plural wavelengths, from a light source, a projection optical system configured to project an image of a pattern of the original onto a substrate, an original-side reference pattern provided at an original side of the projection optical system, a substrate-side reference pattern provided at a substrate side of the projection optical system and image plane detecting means configured so that the original-side reference pattern is illuminated with the exposure light or light equivalent to the exposure light, with respect to a wavelength component rate, whereby an image of the original-side reference pattern is projected onto the substrate-side reference pattern through the projection optical system, and that an image plane position of the projection optical system is detected on the basis of a quantity of light transmitted through or reflected by the substrate-side reference pattern, wherein the original-side reference pattern and the substrate-side reference pattern to be used with the image plane detecting means for detection of the image plane position at an abaxial image height of the projection optical system comprises a plurality of slit-like patterns arrayed in a sagittal direction of the projection optical system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

A first preferred form of the present invention concerns an exposure apparatus in which ultraviolet light having dual wavelengths is used to transfer a circuit pattern of a reticle onto a wafer through a projection optical system, and in which image-plane-position calibration measurement for an off-axis focus measuring system of an oblique incidence type, or the like, is carried out through the projection optical system. When this image-plane-position calibration measurement is carried out with the emission of dual wavelengths, a calibration pattern may comprise a first reference pattern (which may hereinafter be referred to also as a "sagittal pattern") having a plurality of slit-like patterns arrayed periodically in the sagittal direction (lens circumferential direction) of the projection optical system.

A second preferred form of the present invention concerns an exposure apparatus in which ultraviolet light having dual wavelengths is used to transfer a circuit pattern of a reticle onto a wafer through a projection optical system, and in which image-plane-position calibration measurement for an oblique-incidence focus measuring system is carried out through the projection optical system. When this image-plane-position calibration measurement is carried out with the emission of dual wavelengths, with regard to an abaxial image height, the measurement is made by use of a sagittal pattern (Y pattern) and, with regard to axial measurement, both the meridional pattern and the sagittal pattern are used. Furthermore, the amount of field curvature is measured on the basis of the abaxial-image-height measurement value and axial measurement value, to correct the origin of the oblique-incidence focus measuring system.

If the scan direction in the exposure process is taken as the Y direction, the sagittal pattern may comprise a reference pattern having a plurality of slit-like patterns arrayed periodically in the Y direction. The sagittal pattern may be called a "Y pattern". On the other hand, the meridional pattern may comprise a reference pattern having a plurality of slit-like patterns arrayed periodically in the meridional direction of the projection optical system. In the scan type exposure apparatus, the meridional pattern may comprise a reference pattern having a plurality of slit-like patterns arrayed periodically in the X direction, and it may be called an "X pattern".

In a third preferred form of the present invention, the measurement of an image plane position at an abaxial image height and on the axis is carried out in a similar manner as that in the second preferred form of the present invention described above. Then, the meridional field curvature amount is estimated by calculation using the abaxial-image-height measurement value and the axial measurement value, to correct the origin of the oblique-incidence focus measuring system.

A fourth preferred form of the present invention concerns an apparatus in which the exposure can be carried out in accordance with the dual-wavelength exposure method and the single-wavelength exposure method interchangeably. Namely, reference patterns to be used in the image-plane-position calibration measurement, to be carried out through the projection optical system, are interchanged in accordance with the exposure wavelength used. As an example, in the single-wavelength exposure, both the meridional pattern and the sagittal pattern may be used to perform the measurement, whereas in the dual-wavelength exposure, only the sagittal pattern (Y pattern) may be used to perform the abaxial-image-height measurement.

In the preferred form of the present invention described above, for detection of the image plane position based on the reference pattern at an abaxial image height inside the exposure region, the pattern of the sagittal direction of the projection optical system PO is used to detect the image plane position. By doing so, the influence of image blur due to chromatic aberration of the magnification can be reduced effectively.

Figure 5B:
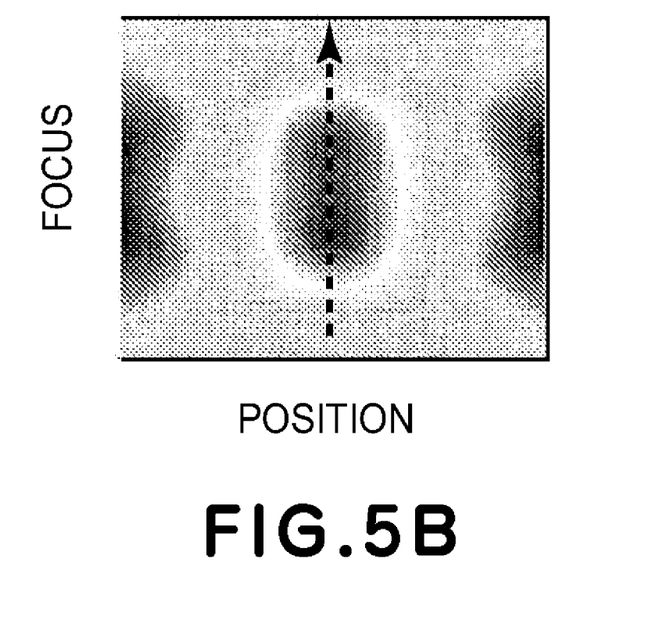
FIG. 5B illustrates another example of an image intensity distribution, in the dual-wavelength exposure.

More specifically, in the case of an exposure apparatus (particularly, a scan type exposure apparatus) that uses an exposure region of an oblong shape having a lengthwise direction extending in a direction perpendicular to the scan direction, the Y pattern may be used for the image-plane-position measurement at an abaxial image height (X image height). Then, the asymmetry of the calibration signal waveform is cancelled, such as shown in FIG. 5B. Since diffraction light from the Y pattern expands in the sagittal plane and, with respect to the sagittal plane, the Y pattern is positioned on the axis, the image of the Y pattern is not influenced by the chromatic aberration of magnification. In this scan type exposure apparatus, the image plane tilt is measured on the basis of sagittal image-plane-position measurement information of the left-side and right-side patterns Ly and Ry inside the slit-like exposure region, such as shown in FIG. 2A.

The third preferred form of the present invention described above is arranged so that, in place of actually measuring the meridional direction pattern, the imaging position of an abaxial meridional pattern is estimated by calculation based on the information of the sagittal pattern.

Particularly, if the exposure is carried out repeatedly, exposure heat is accumulated in the lens, which causes field curvature. It is known from the characteristics of optical imaging that, as compared with a change in the sagittal pattern, the meridional pattern changes three times more. Therefore, once the sagittal pattern is measured, the image plane position of the meridional pattern can be estimated by calculation based on it.

On the other hand, if there is no necessity of measuring the tilt information or image plane shape, in the exposure region on the axis, namely, the lens optical axis, only the X pattern and the Y pattern of image height X=0 and Y=0 are measured, by which the image plane position of the projection optical system can be measured very precisely.

In accordance with the preferred form of the present invention described above, even in the dual-wavelength exposure method, by detecting the exposure-image-plane-position very precisely in the state of an actual wavelength of exposure, the image plane position within the expanded exposure depth of focus can be determined quite accurately. As a result, the depth-of-focus enlargement effect of the dual-wavelength exposure method can be fully used.

Furthermore, the single-wavelength exposure and the dual-wavelength exposure may be interchanged and, even on that occasion, both the X and Y patterns, or only the Y pattern, may be chosen as the calibration measurement pattern in accordance with the choice. Thus, the selectivity of an optimum exposure method best suited to the requirements of a semiconductor exposure process is enlarged.

Next, specific embodiments of the present invention will be described with reference to the drawings.

Figure 1:
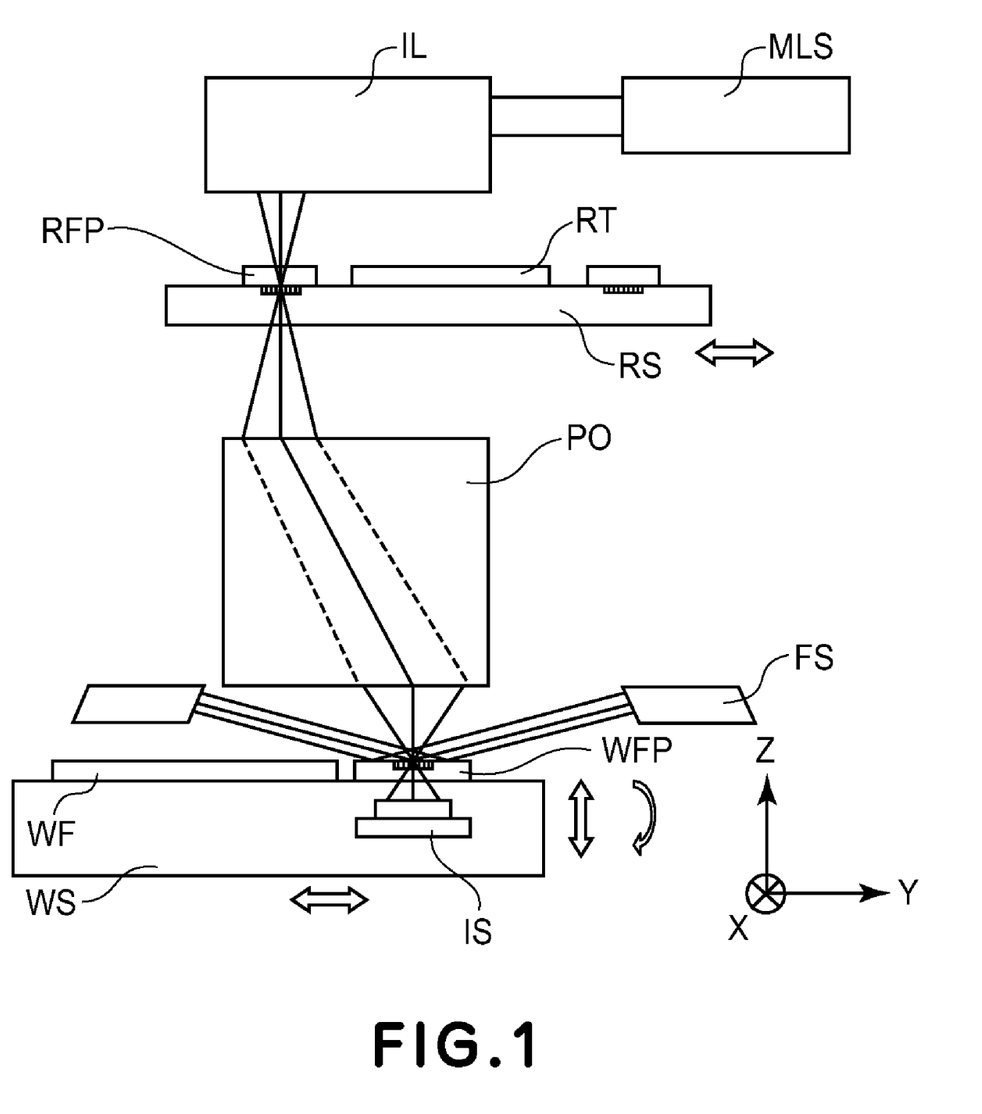
FIG. 1 is a schematic view of a general structure of a scan type exposure apparatus according to an embodiment of the present invention.

FIG. 1 is a schematic view of a general structure of a scan type exposure apparatus according to an embodiment of the present invention.

In FIG. 1, a reticle RT and a wafer WF are disposed at positions approximately optically conjugate with each other with respect to a projection optical system PO. A slit-like exposure region extending in the X direction is defined on the reticle RT, through an exposure illumination optical system IL. By moving both a reticle stage RS and a wafer stage WS relative to the projection optical system PO, at a speed ratio corresponding to the magnification of the projection optical system PO, the pattern of the reticle RT is transferred, by projection exposure, to the wafer WF held on the wafer stage WS.

The structure of the scan type exposure apparatus of FIG. 1 will be described below in greater detail.

The reticle RT is held by the reticle stage RS, which is drive-controlled in the Y direction shown in FIG. 1, by a reticle stage laser interferometer and drive control means, not shown in the drawing. Adjacent to the reticle RT, there is a reticle-side reference plate RFP, which is fixedly provided within a predetermined range of the reticle stage RS. The reticle-side reference plate RFP has a pattern surface, which is set at approximately the same height as that of the reflection surface of the reticle RT. Furthermore, the reflection surface of the reticle-side reference plate RFP is provided with a plurality of position measuring charts defined by a metal surface of Cr or Al, for example.

FIG. 2A is a top plan view of the reticle-side reference plate RFP, which is disposed on the reticle stage RS. There are reticle-side reference charts, which are disposed along a line extending in the lengthwise direction (X direction) of the reticle-side reference plate RFP. These reticle-side reference charts comprise a line-and-space pattern having a plurality of slit-like openings of a size near the exposure resolvable linewidth, such as shown in FIG. 2A, for example.

In FIG. 1, the reticle stage RS is driven while the position thereof in the Z direction in the drawing is held constant with respect to the projection optical system PO. The reticle stage RS has a movable mirror (not shown) fixed thereto, for reflecting the light beam from a laser interferometer (not shown). By means of this laser interferometer, the position and movement amount of the reticle stage RS are monitored successively.

On the other hand, adjacent to the wafer WF, there is a wafer-side reference plate WFP, which is fixedly provided within a predetermined range of the wafer stage WS. The wafer-side reference plate WFP has a reflection surface, which is set at approximately the same height as that of the top surface of the wafer WF, and this reflection surface is provided with a plurality of wafer-side reference charts defined by a metal surface of Cr or Al, for example. The wafer stage WS is made movable in the optical axis direction (Z direction) of the projection optical system PO and along a plane (X-Y plane) perpendicular to the optical axis. Furthermore, rotation (θ direction) about the optical axis and tilt adjustment (tilt) with respect to the image plane are made possible. Thus, it is movable with respect to six axes.

The wafer stage WS, as well, is provided with a movable mirror (not shown) fixed thereto for reflecting a light beam from a wafer stage laser interferometer (not shown). By means of this laser interferometer, the position and movement amount of the wafer stage are monitored successively. On the basis of the result of this measurement, the wafer stage WS is driven with respect to the six axes by using drive control means, not shown in the drawing. The wafer-side reference charts comprise a line-and-space pattern having slit-like openings of a size close to the exposure resolvable linewidth, such as shown in FIG. 2B, for example.

Next, wafer surface position detecting means FS for detecting the position and tilt of the surface of the wafer WF will be explained.

As shown in FIG. 1, there is an oblique-incidence type focus detecting system FS that functions as the wafer surface position detecting means. The focus detecting system FS is arranged so that, through the projection optical system PO, a light beam is projected obliquely onto the wafer WF surface (or wafer-side reference plate WFP surface) to which the reticle RT pattern is going to be transferred. Then, reflection light as reflected obliquely from the wafer WS surface (or wafer-side reference plate WFP surface) is detected.

The focus detecting system FS includes a detecting unit having a position detecting light receiving element corresponding to the reflection light. This light receiving element is disposed so that the light receiving surface thereof is approximately conjugate with the light reflecting point on the wafer WF. As a result, any positional deviation of the wafer WF (or wafer-side reference plate WFP) with respect to the optical axis direction of the projection optical system PO can be measured as a positional deviation on the position detecting light receiving element inside the detecting unit. Particularly, a plurality of light beams and a plurality of position detecting light receiving elements are provided there, not only for detection of the surface position, but also for detection of tilt. Hence, these position detecting light receiving elements are disposed so that their light receiving surfaces are approximately conjugate with the reflection points of respective light beams on the wafer WF. From the results of the surface position measurements made at respective measurement points, the tilt of the surface of the wafer WF (or wafer-side reference plate WFP) is measured.

If the origin of the focus detecting system FS deviates, it causes misregistration of the wafer WF surface with respect to the exposure image plane. Hence, automatic calibration of the measurement points is carried out periodically.

For measurement of this error, there is a TTL (Through-The-Lens) measuring system. The TTL measuring system comprises a reticle-side reference plate RFP, a wafer-side reference plate WFP and a sensor IS. The reticle-side reference plate RFP is provided on the reticle stage RS, as described hereinbefore, and it has a predetermined measuring chart formed on the surface having approximately the same height as that of the reticle RT. The wafer-side reference plate WFP is provided on the wafer stage, as described hereinbefore, and a reference chart is formed on the surface having approximately the same height as that of the wafer surface. The sensor IS is provided below the wafer-side reference plate WFP, and it detects the quantity of light transmitted through the reference chart.

As shown in FIG. 2A, the reticle-side reference plate RFP has a plurality of reference charts formed thereon to enable image plane position measurement at different image heights inside the exposure region. In this embodiment, the reticle-side reference chart and the wafer-side reference chart comprise a slit-like pattern defined by openings, as shown in FIGS. 2A and 2B. Thus, each chart is provided by arrayed openings. FIG. 2B shows the wafer-side reference plate WFP and the wafer-side reference chart. The wafer-side reference chart comprises an X pattern Sx and a Y pattern Sy. If separate sensors IS corresponding to these patterns Sx and Sy are used, image plane position measurement can be made individually. The reference chart is used also for position detection in the two-dimensional direction (X and Y directions) perpendicular to the optical axis of the projection optical system, through the projection optical system. The X pattern Sx is a pattern to be used for position detection with respect to the X direction, and the Y pattern Sy is a pattern to be used for position detection with respect to the Y direction.

Next, an example of image plane position measurement will be explained. First of all, the reticle stage RS is driven so that the reticle-side reference chart is set at a predetermined image height inside the exposure region. Subsequently, the wafer stage WS is driven so that the wafer-side reference chart is placed at or close to the imaging position of the reticle-side reference chart. While moving the wafer stage WS in the optical axis direction of the projection optical system PO, the quantity of light passing through the wafer-side reference chart is monitored to detect the largest light-quantity position. By this, the best imaging position of the projection optical system with regard to that image height can be determined.

FIG. 3 illustrates an example of a best-image-plane-position detection signal. Here, the measurement is carried out as follows: while changing the relative positional relationship between the reticle-side reference chart (slit-like pattern) and the wafer-side reference chart with respect to the optical axis direction (Z direction), the quantity of transmitted light is detected, and the largest light quantity point is determined as the image plane position of the projection optical system PO.

Figure 4:
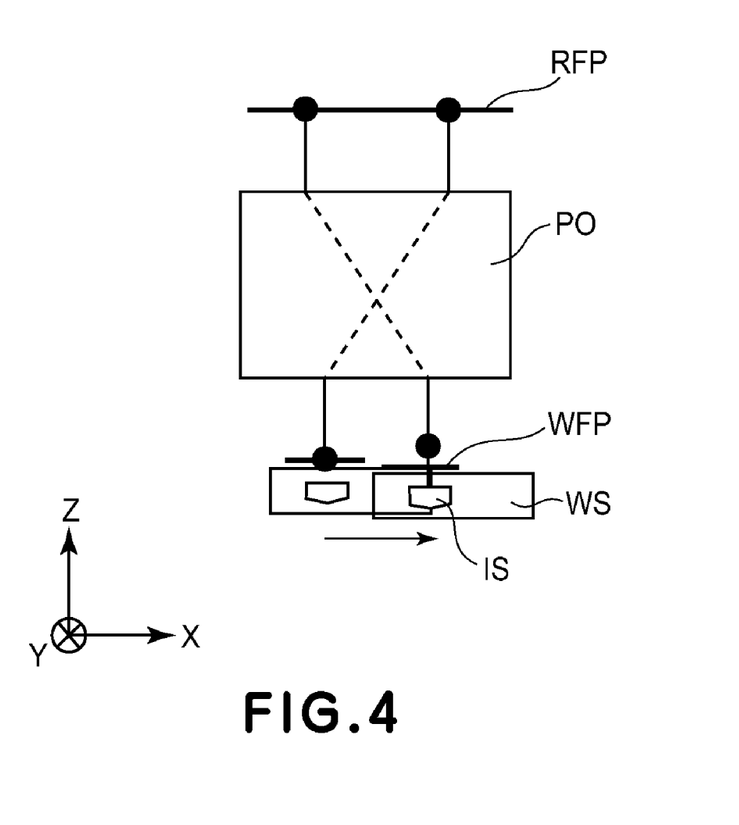
FIG. 4 is a schematic view for explaining an example of an image plane measurement inside the exposure region.

If the image-plane-position measurement is to be carried out with respect to plural image heights inside the exposure region, for measurement of field curvature, for example, as shown in FIG. 4, the wafer stage WS may be driven in the X direction and the measurement may be carried out while aligning the wafer-side reference chart with respect to any reticle-side reference chart on the reticle-side reference plate RFP, having an arbitrary image height.

As a feature of this embodiment, the exposure light source uses a laser MLS, which is arranged to emit exposure light of dual wavelengths being slightly deviated from each other, as means for enlarging the depth of focus.

Furthermore, when the image-plane-position detection is carried out by use of a pattern having an abaxial image height inside the exposure region, a reference pattern having a plurality of slits arrayed in the sagittal direction (lens circumferential direction) of the projection optical system PO is used to detect the image plane position. By doing so, the influence of image blur due to chromatic aberration of magnification is removed. For measurement of the image plane position at the abaxial image height (X image height), the Y (sagittal direction) pattern is used and, by doing so, any asymmetry of an image-plane-position detection signal waveform is avoided. Since the influence of chromatic aberration of magnification appears in the lengthwise direction of the slits that constitute the Y pattern, there is no influence with respect to the linewidth direction, which is effective to the contrast measurement for the image plane position measurement.

More specifically, among the pattern groups inside the exposure region shown in FIG. 2A, patterns L1y, L2y, R1y and R2y, which are sagittal direction patterns, are chosen. Since a minimum of three points is sufficient for the measurement of field curvature having a two-dimensional shape, three image heights L1y, Cx, Cy and R1y may be chosen. Here, the pattern Cx is a meridional direction pattern.

On the other hand, if one-dimensional tilt of the focus measuring system FS and the image plane, that is, tilt measurement, is to be carried out, it may be calculated from the results of image-plane-position measurements at two image heights of L1y and R1y.

Since the patterns Cx and Cy approximately correspond to the optical axis of the projection optical system, in both of the X and Y directions, there is no influence due to chromatic aberration of the dual wavelengths. If there is no necessity of measuring tilt information and image plane shape, only the X and Y patterns of an image height near the axis, namely, the lens optical axis (X=0, Y=0) may be measured to detect the image plane position precisely.

For measurement of the field curvature amount in the dual-wavelength exposure, it is effective to perform the abaxial image height measurement by use of sagittal direction patterns Ly and Ry and to perform axial measurement by use of both the meridional and sagittal patterns Cx and Cy.

Furthermore, it is effective to perform the abaxial image height measurement by use of a sagittal direction pattern and to estimate and to correct the image plane amount of the meridional image on the basis of the predetected relationship with respect to the amount of image plane change, between the sagittal direction and the meridional direction.

Particularly, if the exposure is carried out repeatedly, exposure heat is accumulated in the lens, which causes field curvature. It is known from the characteristics of optical imaging that, as compared with a change in the sagittal pattern, the meridional pattern changes three times more. Therefore, once the sagittal pattern is measured, the image plane position of the meridional pattern can be estimated by calculation based on it.

If the emission wavelength of the laser light source (exposure light source) is changeable between dual-wavelength emission and single-wavelength emission, it is an effective method to perform the exposure while interchanging the dual-wavelength exposure method and the single-wavelength exposure method in accordance with what is required in the exposure process. In such a case, it is effective to choose both the X and Y patterns out of the chart groups prepared in relation to different image heights, for abaxial and axial measurement, as shown in FIG. 2A. More specifically, selecting means for interchanging calibration measuring means may be provided, such that, in the single-wavelength exposure, both the meridional direction pattern and the sagittal direction pattern are used to perform the measurement while, on the other hand, in the dual-wavelength exposure, the abaxial image height is measured by use of a sagittal direction pattern.

Figure 8:
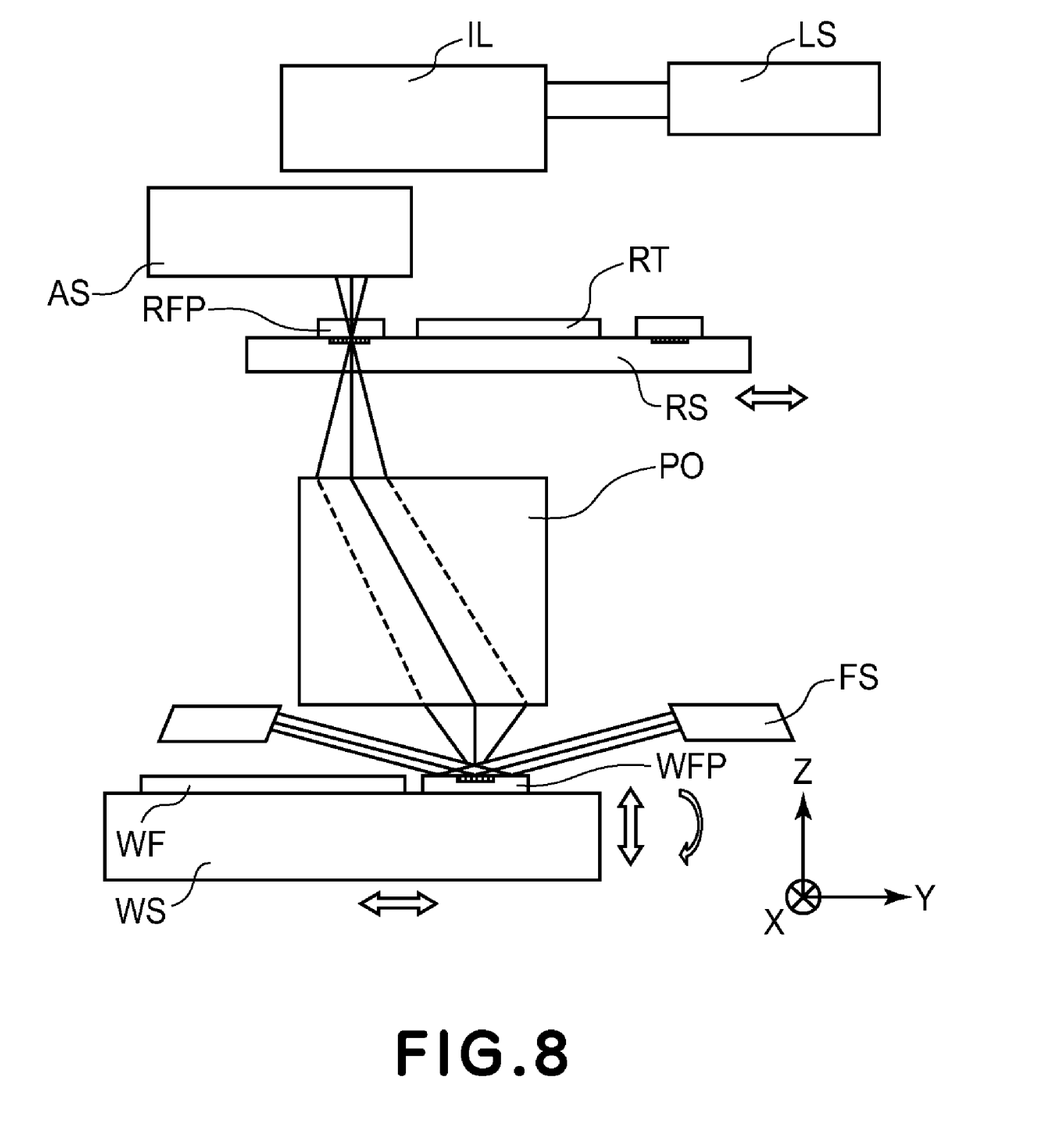
FIG. 8 is a schematic view of a general structure of a scan type exposure apparatus according to another embodiment of the present invention.

Another structural example for the TTL measuring system described above may be that, as shown in FIG. 8, the reference chart on the wafer-side reference plate WFP is detected from the reticle side. Denoted at AS is a TTL observation microscope and a light quantity detecting means, using light having a wavelength equivalent to that of the exposure wavelength. In the case of a microscope, the chart may be illuminated by vertical lighting and the contrast of reflection light may be measured by use of an image pickup device, such as a CCD camera, provided inside the TTL microscope and measuring system AS. The observation light source may be provided by directing light from the exposure light source, or a separate light source may be used therefor.

Figure 9:
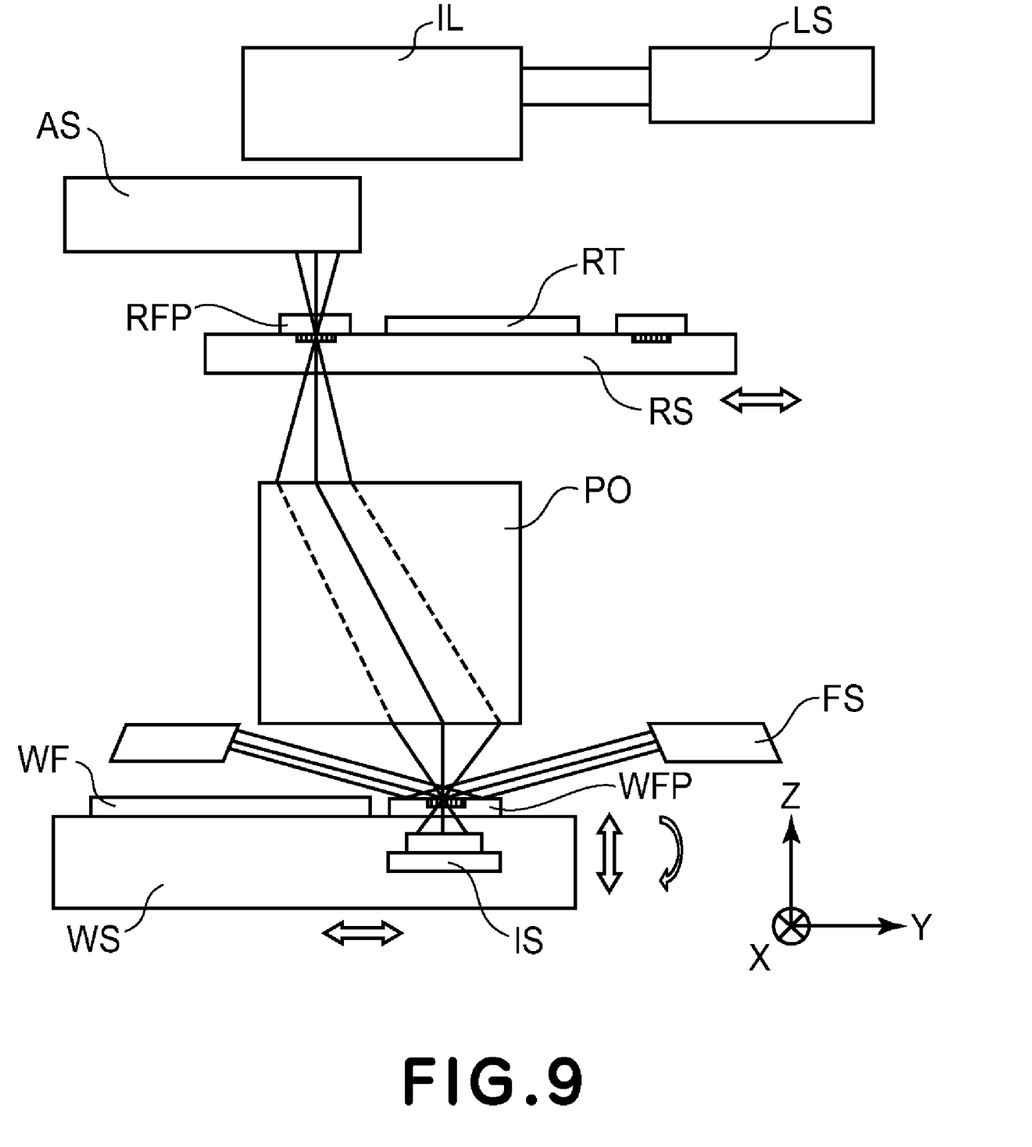
FIG. 9 is a schematic view of a general structure of a scan type exposure apparatus according to a further embodiment of the present invention.

FIG. 9 shows a further structural example. The chart may be illuminated by the TTL observation microscope and measuring system AS described above, and the change in light quantity may be detected by a wafer-side calibration sensor IS. On that occasion, the TTL observation microscope inside the microscope and measuring system AS is not used for the image plane position measurement.

It should be noted here that any other structures may be used, provided that the principle of the present invention is effectively applicable.

In accordance with the embodiment described above, the image plane position of the projection optical system can be measured very precisely in the state of an actual wavelength of the exposure process, using plural wavelengths as those of the dual-wavelength exposure method. As a result, the image plane position in the enlarged exposure depth of focus can be determined very precisely. Hence, the depth-of-focus enlargement effect due to the dual-wavelength exposure method can be fully used. Furthermore, the single-wavelength exposure method and the dual-wavelength exposure method can be used interchangeably, and even in such a case, either both of or only one of the meridional direction pattern and the sagittal direction pattern can be chosen freely in accordance with the exposure method. Therefore, the selectivity of an optimum exposure method to meet the requirements of a semiconductor exposure process is expanded.

Next, referring to FIGS. 10 and 11, an embodiment of a device manufacturing method, which uses an exposure apparatus described above, will be explained.

Figure 10:
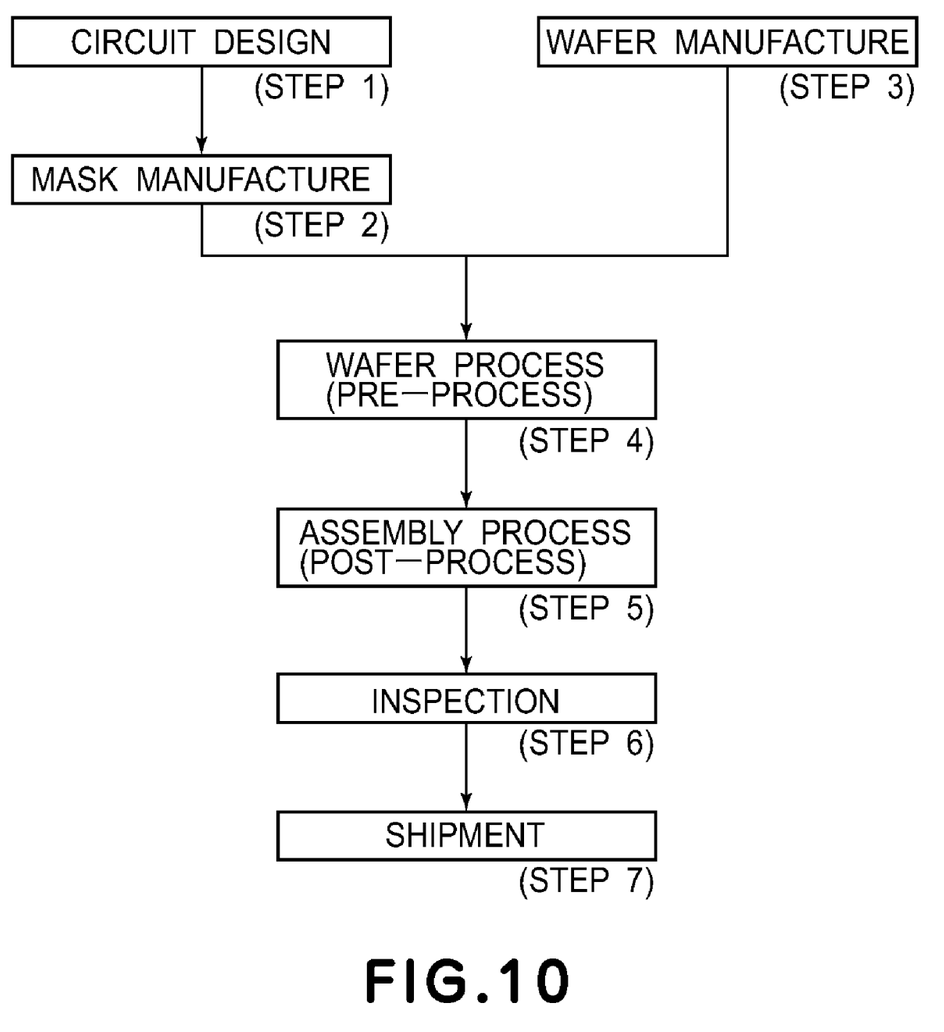
FIG. 10 is a flow chart for explaining an embodiment of device manufacture, using an exposure apparatus.

FIG. 10 is a flow chart for explaining the procedure of manufacturing various microdevices such as semiconductor chips (e.g., ICs or LSIs), liquid crystal devices or CCDs, for example. Here, semiconductor chip production will be described as an example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step, wherein an operation check, a durability check, and so on, for the semiconductor devices produced by step 5, are carried out. With these processes, semiconductor devices are produced, and they are shipped (step 7).

Figure 11:
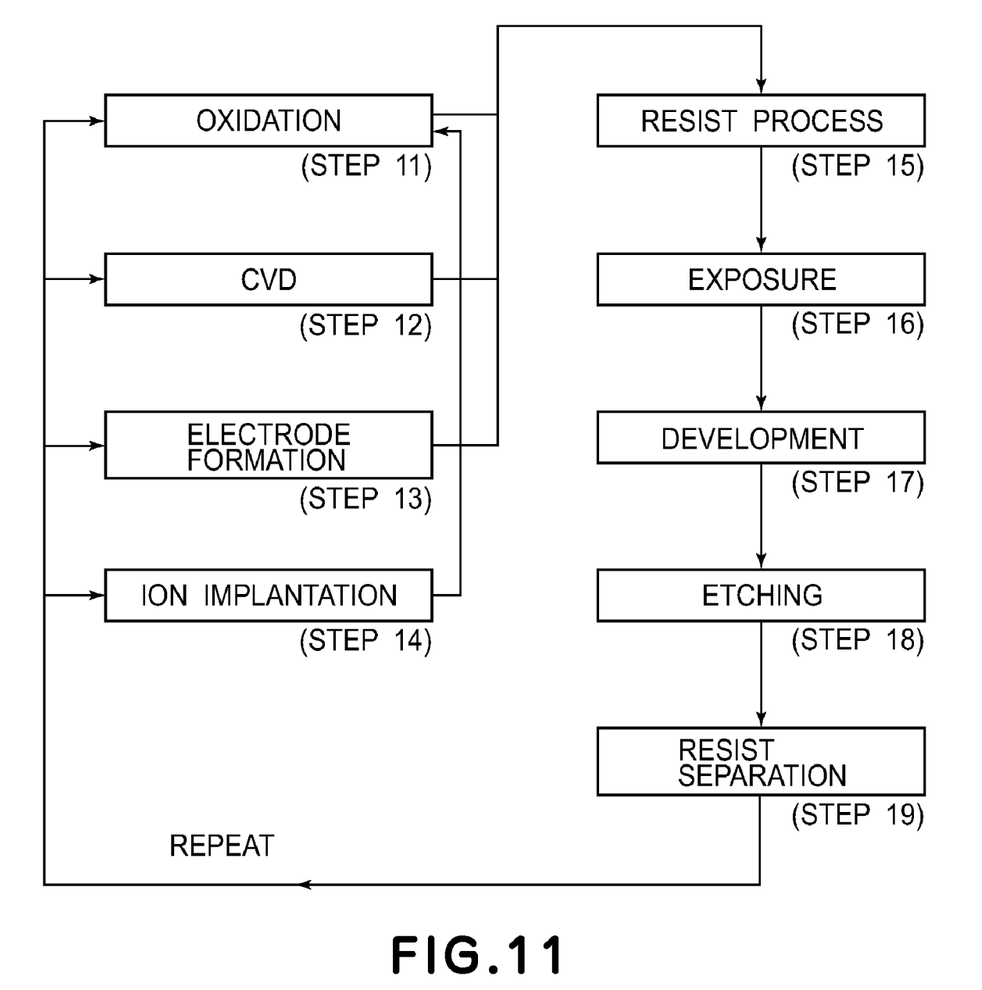
FIG. 11 is a flow chart for explaining details of the wafer process at Step 4 in the flow chart of FIG. 10.

FIG. 11 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Although in the embodiments described above, the present invention is applied to a scan type exposure apparatus, the present invention is applicable also to a simultaneous exposure type exposure apparatus, such as a stepper. Furthermore, although in the embodiments described above, the present invention is applied in relation to a calibration measurement system for an oblique incidence type focal point position detection system, it may be used for the focal point position detection for actual device exposure. On that occasion, the reference pattern for the TTL measuring system may be provided at a position not interfering with the actual device pattern of the substrate to be exposed, for example, at a scribe line position and a position on the original corresponding to it. Furthermore, the embodiments described above concern an example wherein a dual-wavelength light source is used as a light source of plural wavelengths, the present invention is applicable also to an exposure apparatus that uses a light source having three or more wavelengths.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2006-074098 filed Mar. 17, 2006, which is hereby incorporated by reference herein.

What is claimed is:

1. An exposure apparatus, comprising:
   an illumination optical system configured to illuminate an original, with exposure light of plural wavelengths, from a light source;
   a projection optical system configured to project an image of a pattern of the original onto a substrate;
   an original-side reference pattern provided at an original side of said projection optical system;
   a substrate-side reference pattern provided at a substrate side of said projection optical system; and
   image plane detecting means configured so that the original-side reference pattern is illuminated with the exposure light or light equivalent to the exposure light with respect to a wavelength component rate whereby an image of the original-side reference pattern is projected onto the substrate-side reference pattern through said projection optical system, and that an image plane position of said projection optical system is detected on the basis of a quantity of light transmitted through or reflected by the substrate-side reference pattern,
   wherein the original-side reference pattern and the substrate-side reference pattern to be used with said image plane detecting means for detection of the image plane position at an axial image height of said projection optical system comprises a plurality of slit-like patterns arrayed in a sagittal direction of said projection optical system and a plurality of slit-like patterns arrayed in a meridional direction of said projection optical system,
   wherein the original-side reference pattern and the substrate-side reference pattern to be used with said image plane detecting means for detection of the image plane position in the sagittal direction at an abaxial image height of said projection optical system comprises a plurality of slit-like patterns arrayed in the sagittal direction, and
   wherein the image plane position in the meridional direction at the abaxial image height is calculated based on (i) a predetermined relationship between an amount of change of the image plane in the sagittal direction and that in the meridional direction, and (ii) the image plane position in the sagittal direction at the abaxial image height as detected by said image plane detecting means.

2. An apparatus according to claim 1, further comprising sagittal field curvature measuring means configured so that detection of an axial image plane position of said projection optical system through said image plane detecting means is carried out by use of a first reference pattern that comprises a plurality of slit-like patterns arrayed in the sagittal direction of said projection optical system and a second reference pattern that comprises a plurality of slit-like patterns arrayed in a meridional direction of said projection optical system, and that a field curvature amount in the sagittal direction is measured on the basis of a result of detection of the axial image plane position and a result of detection of the image plane position at the abaxial image height.

3. An apparatus according to claim 1, further comprising meridional field curvature measuring means configured so that detection of an axial image plane position of said projection optical system through said image plane detecting means is carried out by use of a first reference pattern that comprises a plurality of slit-like patterns arrayed in the sagittal direction of said projection optical system and a second reference pattern that comprises a plurality of slit-like patterns arrayed in a meridional direction of said projection optical system, and that a field curvature amount in the meridional direction is measured on the basis of a result of detection of the axial image plane position and a result of detection of the image plane position at the abaxial image height.

4. An apparatus according to claim 1, further comprising surface position detecting means configured to project measurement light obliquely onto a surface of the substrate, to be exposed, and to detect a position of the substrate surface to be exposed, on the basis of a position of reflection light from the substrate surface, and calibrating means configured to calibrate the position detected by said surface position detecting means on the basis of the image plane position measured by said image plane detecting means.

5. An apparatus according to claim 1, wherein said light source is configured to interchangeably emit the exposure light of plural wavelengths and exposure light of a single wavelength, and wherein said image plane detecting means includes switching means configured to interchange reference patterns to be used for detection of the image plane position at an abaxial image height of said projection optical system, in accordance with the light emitted from said light source.

6. An image plane detecting method, to be used with an exposure apparatus having an illumination optical system configured to illuminate an original with exposure light of plural wavelengths from a light source and a projection optical system configured to project an image of a pattern of the original onto a substrate, for detecting an image plane position of the projection optical system, said method comprising the steps of:

prov一ding an original-side reference pattern at an original side of the projection optical system;

providing a substrate-side reference pattern at a substrate side of the projection optical system;

illuminating the original-side reference pattern with the exposure light or light equivalent to the exposure light with respect to a wavelength component rate so that an image of the original-side reference pattern is projected onto the substrate-side reference pattern through the projection optical system; and detecting the image plane position of the projection optical system on the basis of a change in a quantity of light transmitted through or reflected by the substrate-side reference pattern, produced as the substrate-side reference pattern is moved in an optical axis direction, wherein the original-side reference pattern and the substrate-side reference pattern to be used for detection of the image plane position at an axial image height of the projection optical system comprises a plurality of slit-like patterns arrayed in a sagittal direction of the projection optical system and a plurality of slit-like patterns arrayed in a meridional direction of the projection optical system, wherein the original-side reference pattern and the substrate-side reference pattern to be used for detection of the image plane position in the sagittal direction at an abaxial image height of the projection optical system comprises a plurality of slit-like patterns arrayed in the sagittal direction, and wherein the image plane position in the meridional direction at the abaxial image height is calculated based on (i) a predetected relationship between an amount of change of the image plane in the sagittal direction and that in the meridional direction, and (ii) the image plane position in the sagittal direction at the abaxial image height as detected in said image plane position detecting step.

7. A method according to claim 6, wherein said image plane position detecting step includes a sagittal field curvature measuring step in which detection of an axial image plane position of the projection optical system is carried out by use of a first reference pattern that comprises a plurality of slit-like patterns arrayed in the sagittal direction of the projection optical system and a second reference pattern that comprises a plurality of slit-like patterns arrayed in a meridional direction of the projection optical system, and in which a field curvature amount in the sagittal direction is measured on the basis of a result of detection of the axial image plane position and a result of detection of the image plane position at the abaxial image height.

8. A method according to claim 6, wherein said image plane position detecting step includes a meridional field curvature calculating step in which detection of an axial image plane position of the projection optical system is carried out by use of a first reference pattern that comprises a plurality of slit-like patterns arrayed in the sagittal direction of the projection optical system and a second reference pattern that comprises a plurality of slit-like patterns arrayed in a meridional direction of the projection optical system, and in which a field curvature amount in the meridional direction is calculated on the basis of a result of detection of the axial image plane position and a result of detection of the image plane position at the abaxial image height.

9. A method according to claim 6, wherein the light source is configured to interchangeably emit the exposure light of plural wavelengths and exposure light of a single wavelength, and wherein reference patterns to be used for detection of the image plane position at an abaxial image height of the projection optical system are interchanged in accordance with the light emitted from the light source.

10. A device manufacturing method, comprising the steps of:

exposing a substrate by use of an exposure apparatus as recited in claim 1; and developing the exposed substrate.

* * * * *